(12) United States Patent
Song et al.

(10) Patent No.: US 11,056,894 B2
(45) Date of Patent: Jul. 6, 2021

(54) BATTERY MANAGEMENT APPARATUS, AND BATTERY PACK AND AUTOMOBILE INCLUDING SAME

(71) Applicant: LG Chem, Ltd., Seoul (KR)

(72) Inventors: Hyeon-Jin Song, Daejeon (KR); Seon-Uk Yu, Daejeon (KR); Yang-Lim Choi, Daejeon (KR)

(73) Assignee: LG Chem, Ltd.

( * ) Notice: Subject to any disclaimer, the term of this patent is extended or adjusted under 35 U.S.C. 154(b) by 193 days.

(21) Appl. No.: 16/549,135

(22) Filed: Aug. 23, 2019

(65) Prior Publication Data

US 2019/0379217 A1  Dec. 12, 2019

Related U.S. Application Data

(63) Continuation of application No. PCT/KR2018/010377, filed on Sep. 5, 2018.

(30) Foreign Application Priority Data

Sep. 25, 2017  (KR) .................. 10-2017-0123460

(51) Int. Cl.
*H02J 7/00* (2006.01)
*B60L 58/10* (2019.01)
*B60L 3/04* (2006.01)

(52) U.S. Cl.
CPC .............. *H02J 7/0026* (2013.01); *B60L 3/04* (2013.01); *B60L 58/10* (2019.02); *B60L 2210/40* (2013.01)

(58) Field of Classification Search
USPC ........................................................ 320/134
See application file for complete search history.

(56) References Cited

U.S. PATENT DOCUMENTS

2006/0021098 A1  1/2006  Tezuka
2006/0224360 A1  10/2006  Kishimoto
(Continued)

FOREIGN PATENT DOCUMENTS

JP   2006278210 A   10/2006
JP   4572168 B2     10/2010
(Continued)

OTHER PUBLICATIONS

Extended European Search Report including the Written Opinion for Application No. EP 18858054.2 dated Jan. 14, 2020, 7 pages.
(Continued)

*Primary Examiner* — Mohammed Alam
(74) *Attorney, Agent, or Firm* — Lerner, David, Littenberg, Krumholz & Mentlik, LLP

(57) ABSTRACT

Disclosed is a battery management apparatus, which includes: a precharging unit having a plurality of switches, the precharging unit being connected to the first main relay in parallel and connected between the second main relay and the second charge/discharge terminal; a control unit configured to control the plurality of switches which causes an output voltage of the battery module to be converted into an AC voltage and applied to the first main relay or the second main relay; and a diagnosing unit configured to diagnose a failure of the first main relay based on a first both-end voltage value of the first main relay to which the AC voltage is applied or to diagnose a failure of the second main relay based on a second both-end voltage value of the second main relay to which the AC voltage is applied.

10 Claims, 6 Drawing Sheets

(56) References Cited

U.S. PATENT DOCUMENTS

| | | | |
|---|---|---|---|
| 2011/0316489 A1 | 12/2011 | Norimatsu et al. | |
| 2012/0319648 A1* | 12/2012 | Ohtomo | B60L 50/66 320/109 |
| 2013/0009598 A1* | 1/2013 | Ohtomo | H02J 7/0027 320/109 |
| 2013/0106423 A1 | 5/2013 | Moon et al. | |
| 2013/0257440 A1 | 10/2013 | Takahashi et al. | |
| 2014/0077731 A1* | 3/2014 | Kuwano | H02J 7/0019 318/139 |
| 2016/0075251 A1 | 3/2016 | Choi | |
| 2019/0359078 A1* | 11/2019 | Yamada | B60L 53/60 |
| 2019/0379217 A1* | 12/2019 | Song | B60L 3/00 |
| 2021/0006084 A1* | 1/2021 | Kikuchi | H02J 7/00306 |

FOREIGN PATENT DOCUMENTS

| | | | |
|---|---|---|---|
| JP | 2013206643 A | 10/2013 | |
| JP | 5697034 B2 | 4/2015 | |
| JP | 2015095442 A | 5/2015 | |
| KR | 1273820 B1 | 9/2011 | |
| KR | 1241226 B1 | 3/2013 | |
| KR | 20140079112 A | 6/2014 | |
| KR | 20140136844 A | 12/2014 | |
| KR | 20160031808 A | 3/2016 | |
| KR | 20160054935 A | 5/2016 | |
| KR | 20160127671 A | 11/2016 | |
| KR | 20170010999 A | 2/2017 | |
| KR | 20170097481 A | 8/2017 | |
| KR | 20170099287 A | 8/2017 | |
| KR | 101780396 B1 | 9/2017 | |

OTHER PUBLICATIONS

International Search Report dated Feb. 8, 2019, in PCT/KR2018/010377, 2 pages.

* cited by examiner

BATTERY MANAGEMENT APPARATUS, AND BATTERY PACK AND AUTOMOBILE INCLUDING SAME

CROSS-REFERENCE TO RELATED APPLICATIONS

The present application is a continuation of International Application No. PCT/KR2018/010377 filed Sep. 5, 2018, which claims priority from Korean Patent Application No. 10-2017-0123460 filed on Sep. 25, 2017 in the Republic of Korea, all of which are incorporated herein by reference.

TECHNICAL FIELD

The present disclosure relates to a battery management apparatus, and a battery pack and a vehicle including the battery management apparatus. More particularly, the present disclosure relates to a battery management apparatus for performing precharging when a battery pack makes an output and diagnosing a main relay of the battery pack, and a battery pack and a vehicle including the battery management apparatus.

BACKGROUND ART

Secondary batteries, which are easy to apply to various product groups and have good electrical energy characteristics such as high energy density, are widely used for electric vehicles (EVs) or hybrid vehicles (HVs), driven by electric driving sources, as well as portable devices.

The secondary batteries are capable of repeatedly charging and discharging by electrochemical reactions, which may reduce the use of fossil fuels drastically, and also generate no by-products due to the use of energy. For this reason, the secondary batteries are attracting attention as a new environment-friendly energy source for improving energy efficiency.

Generally, an assembly includes a plurality of unit assembly secondary cells, and a battery pack applied to a vehicle or the like includes a plurality of the assemblies or battery modules. The cell includes a positive electrode current collector, a separator, an active material, an electrolyte, an aluminum thin film layer and the like and allows charging and discharging by an electrochemical reaction among the components.

These battery packs have a problem of low safety in spite of excellent electrical characteristics. For example, when a lithium secondary battery is used, a decomposition reaction of battery components such as an active material and an electrolyte is caused in an abnormal operation state such as overcharge, overdischarge, exposure to a high temperature and electric power failure to generate heat and gas, and high temperature and high pressure conditions caused by the heat and gas further accelerate the decomposition reaction, thereby leading to ignition or explosion.

In particular, a battery pack applied to a vehicle or the like has a problem that when an impact caused by a vehicle collision is applied, the battery pack itself is ignited or exploded due to the impact, and a generated fire leads to a vehicle fire.

To solve this problem, there is a demand for a technology for controlling the output and electric flow of a battery pack so that ignition or explosion does not occur from the battery pack when a collision accident occurs at a vehicle to which the battery pack is applied.

SUMMARY

Technical Problem

The present disclosure is directed to providing a battery management apparatus, which may convert an output voltage of a battery module into an alternating current (AC) voltage and apply to a first main relay and a second main relay, and diagnose a failure of the first main relay and the second main relay based on a both-end voltage value of the first main relay and the second main relay, and to providing a battery pack and a vehicle including the battery management apparatus.

In addition, the present disclosure is directed to providing a battery management apparatus, which may perform precharging by using an output voltage of a battery module so that a charging voltage value of an output capacitor has a voltage value lower than a voltage value of the output voltage, and to providing a battery pack and a vehicle including the battery management apparatus.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery management apparatus for managing a battery pack, which includes a battery module, a first charge/discharge terminal, a second charge/discharge terminal, a first main relay connected between a positive electrode terminal of the battery module and the first charge/discharge terminal, and a second main relay connected between a negative electrode terminal of the battery module and the second charge/discharge terminal.

Preferably, the battery management apparatus may comprise: a precharging unit having a plurality of switches, the precharging unit being connected to the first main relay in parallel and connected between the second main relay and the second charge/discharge terminal; a control unit configured to control the plurality of switches to cause an output voltage of the battery module is converted into an AC voltage and applied to the first main relay or the second main relay; and a diagnosing unit configured to diagnose a failure of the first main relay based on a first both-end voltage value of the first main relay when the AC voltage is applied to the first main relay, and to diagnose a failure of the second main relay based on a second both-end voltage value of the second main relay when the AC voltage is applied.

Preferably, the precharging unit may include: a first switch having one end connected to a first node between the first main relay and the positive electrode terminal; a second switch having one end connected to the other end of the first switch; an inductor having one end connected to the other end of the second switch and having the other end connected to a second node between the first main relay and the first charge/discharge terminal; and a third switch having one end connected to a third node between the first switch and the second switch and having the other end connected to a fourth node between the second main relay and the second charge/discharge terminal.

Preferably, when the first main relay and the second main relay are in an OFF state, the control unit may be configured to control the second switch to an OFF state and controls the third switch to an ON state, and then to control the first switch to repeatedly alternate between an ON state and an OFF state in a manner that causes the AC voltage to be applied to the second main relay.

Preferably, when the first main relay is in an OFF state and the second main relay is in an ON state, the control unit may be configured to control the first switch to an OFF state and to control the third switch to an ON state, and then control the second switch to repeatedly alternate between the ON state and the OFF state so that the AC voltage is applied to the first main relay.

Preferably, when the AC voltage is applied to the first main relay, the diagnosing unit may be configured to compare the first both-end voltage value with a first partial fusion voltage value, and to diagnose that partial fusion occurs at the first main relay when the first both-end voltage value is equal to the first partial fusion voltage value as a result of the comparison.

Preferably, when the AC voltage is applied to the first main relay, the diagnosing unit may be configured to compare the first both-end voltage value with a preset first normal voltage value, and to diagnose that no partial fusion occurs at the first main relay when the first both-end voltage value is equal to the preset first normal voltage value as a result of the comparison.

Preferably, when the AC voltage is applied to the second main relay, the diagnosing unit may be configured to compare the second both-end voltage value with a second partial fusion voltage value, and to diagnose that partial fusion occurs at the second main relay when the second both-end voltage value is equal to the second partial fusion voltage value as a result of the comparison.

Preferably, when the AC voltage is applied to the second main relay, the diagnosing unit may be configured to compare the second both-end voltage value with a preset second normal voltage value, and to diagnose that no partial fusion occurs at the second main relay when the second both-end voltage value is equal to the preset second normal voltage value as a result of the comparison.

A battery pack according to the present disclosure may comprise the battery management apparatus.

A vehicle according to the present disclosure may comprise the battery management apparatus.

Advantageous Effects

According to the present disclosure, since the output voltage of the battery module may be converted into an AC voltage and applied to the first main relay and the second main relay to diagnose a failure, it is possible to protect the battery pack from overdischarge, overcharge and overcurrent.

Since the output voltage of the battery module is reduced to a reduced voltage and outputting to a load and the connection state inside the load is diagnosed based on a load current value of the current flowing in the load, it is possible to protect the battery pack against a load having a problem in its connection state.

In addition, in the present disclosure, since precharging is performed by using the output voltage of the battery module so that a charging voltage value of an output capacitor has a voltage value lower than a voltage value of the output voltage, it is possible to protect the main relay and the load from a surge current.

DETAILED DESCRIPTION

Figure 1:
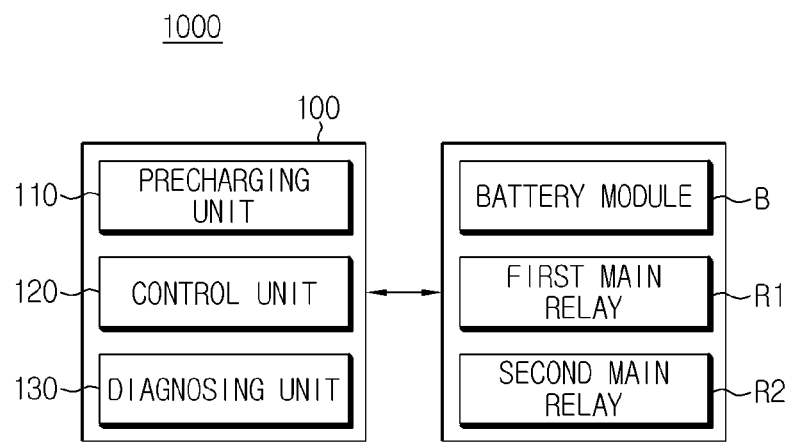
FIG. 1 is a diagram schematically showing a battery management apparatus according to an embodiment of the present disclosure and a battery pack including the battery management apparatus.

The above objects, features and advantages will be described in detail below with reference to the accompanying drawings, so that those skilled in the art to which the present disclosure belongs can easily implement the technical idea of the present disclosure. In the explanations of the present disclosure, if it is deemed that any specific explanation of the related technology can unnecessarily obscure the gist of the present disclosure, the detailed explanation may be omitted. Hereinafter, a preferred embodiment according to the present disclosure will be described in detail with reference to the accompanying drawings. In the drawings, the same reference numerals are used to indicate the same or similar components.

The term "unit" as used in the specification (e.g., precharging unit, control unit, diagnosing unit) refers to a unit that processes at least one function or operation. The unit may be implemented by hardware (e.g., one or more switches, one or more processors), software (e.g., one or more applications, one or more programs) or a combination thereof.

Figure 2:
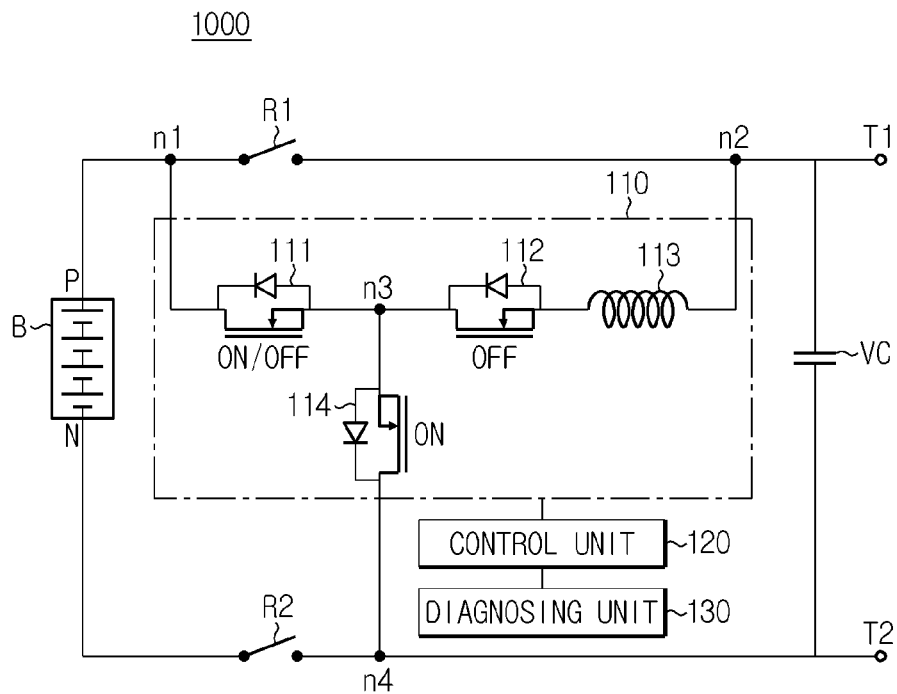
FIG. 2 is a circuit diagram schematically showing the battery management apparatus according to an embodiment of the present disclosure and the battery pack including the battery management apparatus.

FIG. 1 is a diagram schematically showing a battery management apparatus 100 according to an embodiment of the present disclosure and a battery pack 1000 including the battery management apparatus 100, and FIG. 2 is a circuit diagram schematically showing the configuration and the circuit connection of the battery management apparatus 100 according to an embodiment of the present disclosure and the battery pack 1000 including the battery management apparatus 100.

Referring to FIGS. 1 and 2, the battery management apparatus 100 according to an embodiment of the present disclosure may be included in the battery pack 1000, and the battery pack 1000 may include a battery module B, a first charge/discharge terminal T1, a second charge/discharge terminal T2, an output capacitor VC connected between the first charge/discharge terminal T1 and the second charge/discharge terminal T2, a first main relay R1 connected between a positive electrode terminal P of the battery module B and the first charge/discharge terminal T1, and a second main relay R2 connected between a negative electrode terminal N of the battery module B and the second charge/discharge terminal T2.

The first main relay R1 may be controlled to be in an ON state or an OFF state to change the electrical connection between the positive electrode terminal P of the battery module B and the first charge/discharge terminal T1.

The second main relay R2 may be controlled to be in an ON state or an OFF state to change the electrical connection between the negative electrode terminal N of the battery module B and the second charge/discharge terminal T2.

The battery management apparatus 100 according to an embodiment of the present disclosure, included in the battery pack 1000, may diagnose a failure of the first main relay R1 and the second main relay R2 and perform precharging when the battery pack 1000 makes an output.

Hereinafter, the process of diagnosing a failure of the battery management apparatus 100 according to an embodiment of the present disclosure and performing precharging will be described.

The battery management apparatus 100 according to an embodiment of the present disclosure may include a precharging unit 110, a control unit 120, and a diagnosing unit 130.

The precharging unit 110 has a plurality of switches 111, 112, 114 and an inductor 113. The precharging unit 110 may be connected to the first main relay R1 in parallel and be connected between the second main relay R2 and the second charge/discharge terminal T2.

More specifically, the precharging unit 110 may include a first switch 111, a second switch 112, an inductor 113, and a third switch 114.

The first switch 111 may have one end connected to a first node n1 between the first main relay R1 and the positive electrode terminal P.

The second switch 112 may have one end connected to the other end of the first switch 111.

The inductor 113 may have one end connected to the other end of the second switch 112 and have the other end connected to a second node n2 between the first main relay R1 and the first charge/discharge terminal T1.

The third switch 114 may have one end connected to a third node n3 between the first switch 111 and the second switch 112 and have the other end connected to a fourth node n4 between the second main relay R2 and the second charge/discharge terminal T2.

That is, the first switch 111, the second switch 112 and the inductor 113 may be serially connected in order and connected to the first main relay R1 in parallel, and the third switch 114 may be connected between the third node n3 and the fourth node n4.

In an embodiment, the plurality of switches 111, 112, 114 included in the precharging unit 110 may be a MOSFET. By doing so, the control unit 120 may quickly control the operating states of the plurality of switches 111, 112, 114.

The operation states of the plurality of switches 111, 112, 114 provided in the precharging unit 110 may be controlled by the control unit 120.

More specifically, the control unit 120 may control the operation states of the plurality of switches 111, 112, 114 provided in the precharging unit 110 in response to a command signal input from the diagnosing unit 130. By doing so, the control unit 120 may convert the output voltage of the battery module B into an AC voltage and apply the AC voltage to at least one of the first main relay R1 and the second main relay R2.

When receiving a second diagnosis command signal for diagnosing a failure of the second main relay R2 from the diagnosing unit 130, the control unit 120 according to an embodiment may receive power to initiate the operation.

After that, as shown in FIG. 2, in response to the second diagnosis command signal, the control unit 120 may control the second switch 112 to the OFF state, control the third switch 114 to the ON state, and control the first switch 111 to alternately repeat the ON state and the OFF state.

At this time, the operation state of the first main relay R1 and the second main relay R2 may be the OFF state.

That is, if the second diagnosis command signal is received, the control unit 120 may control the second switch 112 and the third switch 114 to the OFF state and the ON state, respectively, and then control only the first switch 111 to alternately repeat the ON state and the OFF state.

Figure 3:
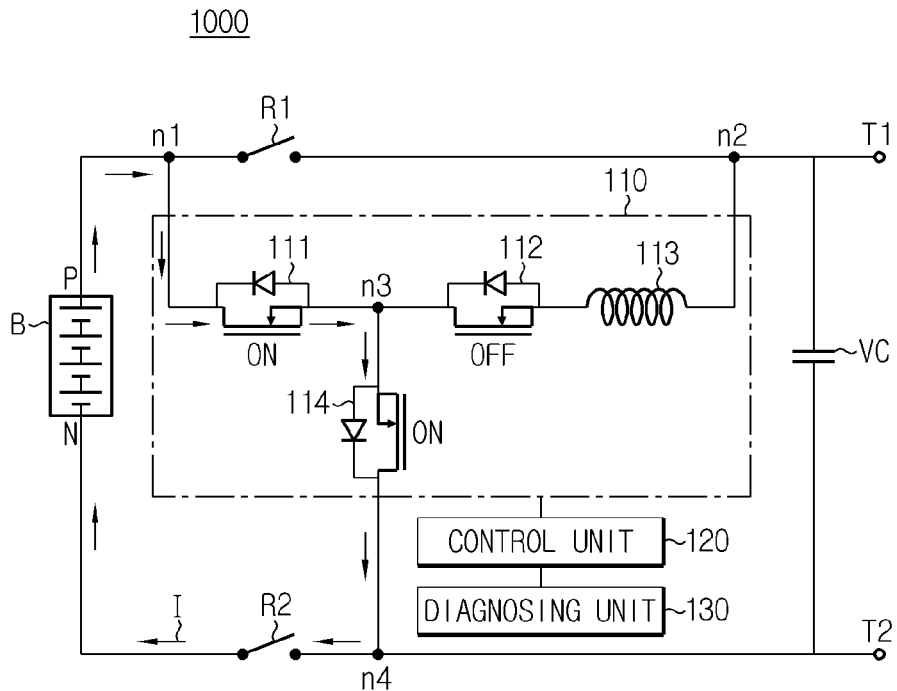
FIGS. 3 and 4 are circuit diagrams for illustrating a process of applying an AC voltage to a second main relay so that the battery management apparatus according to an embodiment of the present disclosure diagnoses the second main relay.
Figure 4:
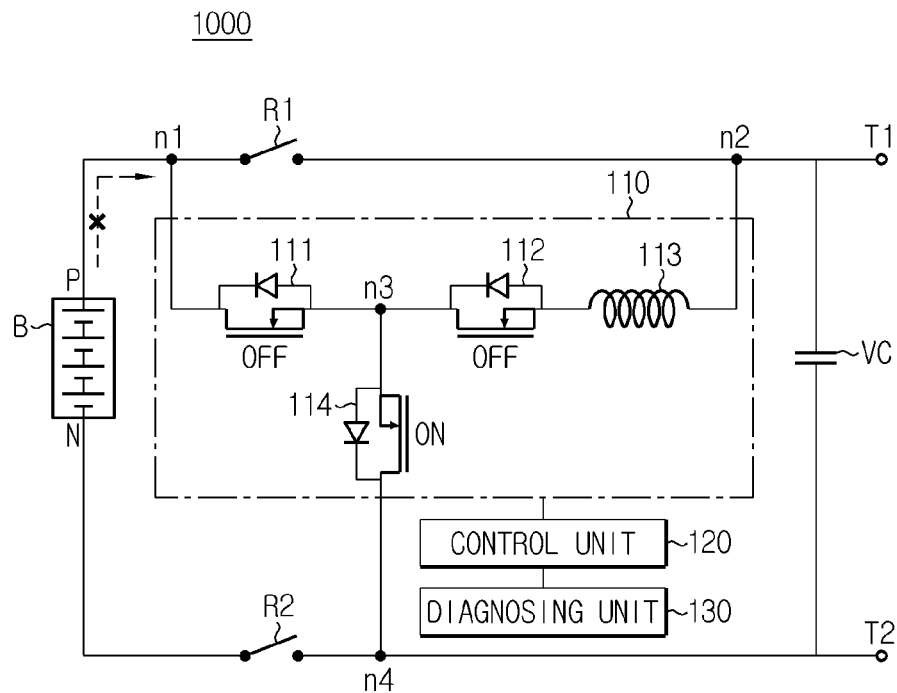

FIGS. 3 and 4 are circuit diagrams for illustrating a process of applying an AC voltage to the second main relay R2 so that the battery management apparatus 100 according to an embodiment of the present disclosure diagnoses the second main relay R2.

Referring to FIGS. 3 and 4, as shown in FIG. 3, the control unit 120 may control the second switch 112 and the third switch 114 to the OFF state and the ON state, respectively, and then control the operation state of the first switch 111 to the ON state.

Accordingly, the output voltage of the battery module B is applied to a closed circuit in which the first switch 111, the third switch 114 and the second main relay R2 are serially connected in order, and the voltage may be applied to the second main relay R2 so that current may flow.

On the contrary, as shown in FIG. 4, the control unit 120 may control the second switch 112 and the third switch 114 to the OFF state and the ON state, respectively, and then control the operation state of the first switch 111 to the OFF state.

Accordingly, all circuits connected to the positive electrode terminal P and the negative electrode terminal N of the battery module B are opened so that no voltage is applied to the second main relay R2 and no current flows.

In this way, the control unit 120 may apply an AC voltage to the second main relay R2 by controlling the second switch 112 and the third switch 114 to the OFF state and the ON state, respectively, and then controlling the operation state of only the first switch 111 to alternately repeat the ON state and the OFF state.

At this time, the control unit 120 may set so that the AC current of a preset second current value flows to the second main relay R2 by controlling the plurality of switches 111, 112, 114 as described above, and may set so that the AC current of a preset second frequency flows to the second main relay R2.

In an embodiment, the control unit 120 and the precharging unit 110 may be implemented as a single buck converter. In addition, the control unit 120 may be a square wave generator or a microcontroller (MCU) that generates a square wave to control the operation states of the plurality of switches 111, 112, 114 provided in the precharging unit 110.

Meanwhile, the diagnosing unit 130 may transmit a second diagnosis command signal to the control unit 120 to diagnose a failure of the second main relay R2, as described above. After that, the diagnosing unit 130 may diagnose a failure of the second main relay R2 based on a second both-end voltage value of the second main relay R2 to which the AC voltage is applied, as the control unit 120 controls the plurality of switches 111, 112, 114 provided in the precharging unit 110.

More specifically, after the second diagnosis command signal is transmitted to the control unit 120, if the AC voltage is applied to the second main relay R2, the diagnosing unit 130 may compare the second both-end voltage value with a second partial fusion voltage value, and diagnose partial fusion occurs at the second main relay R2 when the second both-end voltage value is equal to the second partial fusion voltage value.

On the contrary, after the second diagnosis command signal is transmitted to the control unit 120, if the AC voltage is applied to the second main relay R2, the diagnosing unit 130 may compare the second both-end voltage value with a preset second normal voltage value, and diagnose that no partial fusion occurs at the second main relay R2 when the second both-end voltage value is equal to the preset second normal voltage value.

Here, if the AC voltage is applied to the second main relay R2 at which partial fusion occurs as the control unit 120 receiving the second diagnosis command signal controls the plurality of switches 111, 112, 114, the second partial fusion voltage value may be a voltage value measured at both ends of the second main relay R2.

Figure 5:
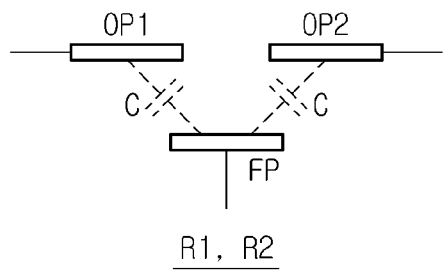
FIG. 5 is a diagram showing a contact point when the first main relay and the second main relay are in a normal state.
Figure 6:
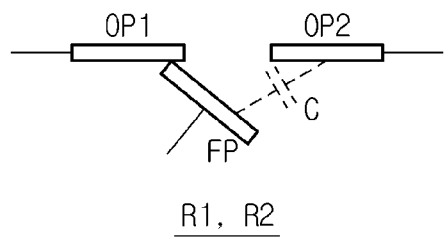
FIG. 6 is a diagram showing a contact point when partial fusion occurs at the first main relay and the second main relay.

FIG. 5 is a diagram showing a contact point when the first main relay R1 and the second main relay R2 are in a normal state, and FIG. 6 is a diagram showing a contact point when partial fusion occurs at the first main relay R1 and the second main relay R2.

Referring to FIGS. 5 and 6 further, if the operation state of the second main relay R2 where no partial fusion occurs is in the OFF state as shown in FIG. 5, a capacitance component C may be generated between a first movable contact point OP1 and a fixed contact point FP, and a capacitance component C may also be generated between a second movable contact point OP2 and the fixed contact point FP. Accordingly, two capacitance components C may be serially connected to the second main relay R2 where no partial fusion occurs, and thus a capacitance component C/2 may be generated in total.

On the contrary, if the operation state of the second main relay R2 where partial fusion occurs is in the OFF state as shown in FIG. 6, the capacitance component may disappear between the first movable contact point OP1 and the fixed contact point FP, and a capacitance component C may also be generated between the second movable contact point OP2 and the fixed contact point FP. Accordingly, only one capacitance component C is generated at the second main relay R2 where partial fusion occurs, and thus the capacitance component C may be generated in total.

The control unit 120 receiving the second diagnosis command signal may control the plurality of switches 111, 112, 114 so that the AC current of a preset second current value and a preset second frequency flows to the second main relay R2 as described above.

At this time, the diagnosing unit 130 may set the second partial fusion voltage value by using the preset second current value, the preset second frequency and the total capacitance of the second main relay R2 where partial fusion occurs, and diagnose partial fusion of the second main relay R2 by comparing the set second partial fusion voltage value with the second both-end voltage value of the second main relay R2.

More specifically, the diagnosing unit 130 may set the second partial fusion voltage value using Equation 1 below.

$$V2'=I2(\pi/2)fC \qquad \text{<Equation 1>}$$

Here, V2' may represent a second partial fusion voltage value, I2 may represent a preset second current value, f may represent a preset second frequency, and C may represent total capacitance of the second main relay R2 where partial fusion occurs.

By doing so, the diagnosing unit 130 may diagnose that partial fusion occurs at the second main relay R2 if the second both-end voltage value of the second main relay R2 is equal to the second partial fusion voltage value.

It has been described that the diagnosing unit 130 according to an embodiment as described above diagnoses the partial fusion of the second main relay R2 if the second both-end voltage value is equal to the second partial fusion voltage value. However, the diagnosing unit 130 according to another embodiment may set a second partial fusion voltage range again based on the set second partial fusion voltage value, and then diagnose that partial fusion occurs at the second main relay R2 if the second both-end voltage value is included in the second partial fusion voltage range.

By doing so, the diagnosing unit 130 according to another embodiment may prevent a diagnosis error caused by a circuit configuration in the battery pack 1000 and a measurement error due to a voltage sensor and a current sensor.

Meanwhile, the diagnosing unit 130 may set the second normal voltage value by using the preset second current value, the preset second frequency and the total capacitance of the second main relay R2 where the partial fusion occurs, and then diagnose whether the second main relay R2 is normal by comparing the set second normal voltage value with the second both-end voltage value of the second main relay R2.

More specifically, the diagnosing unit 130 may set the second normal voltage value using Equation 2 below.

$$V2=I2(\pi/2)f(C/2) \qquad \text{<Equation 2>}$$

Here, V2 may represent a second normal voltage value, I2 may represent a preset second current value, f may represent a preset second frequency, and C may represent total capacitance of the second main relay R2 where partial fusion occurs.

By doing so, the diagnosing unit 130 may diagnose that no partial fusion occurs at the second main relay R2 if the second both-end voltage value of the second main relay R2 is equal to the second normal voltage value.

It has been described that the diagnosing unit 130 according to an embodiment as described above diagnoses that no partial fusion occurs at the second main relay R2 if the second both-end voltage value is equal to the second normal voltage value. However, the diagnosing unit 130 according to another embodiment may set a second normal voltage range again based on the set second normal voltage value, and diagnose that no partial fusion occurs at the second main relay R2 if the second both-end voltage value is included in the second normal voltage range.

By doing so, the diagnosing unit 130 according to another embodiment may prevent a diagnosis error caused by a circuit configuration in the battery pack 1000 and a measurement error due to a voltage sensor and a current sensor.

Meanwhile, the diagnosing unit 130 according to another embodiment may diagnose that no partial fusion occurs at the second main relay R2 if the second both-end voltage value is different from the second partial fusion voltage value.

In addition, the diagnosing unit 130 according to another embodiment may diagnose that a failure other than the partial fusion occurs at the second main relay R2 if the second both-end voltage value is different from the second partial voltage value and the second normal voltage value.

Meanwhile, if it is diagnosed that partial fusion occurs at the second main relay R2, the diagnosing unit 130 may stop the charging/discharging of the battery pack 1000 by controlling the operation state of the first main relay and the second main relay to the OFF state.

Hereinafter, the process of diagnosing whether or not a failure occurs at the first main relay R1 will be described.

Figure 7:
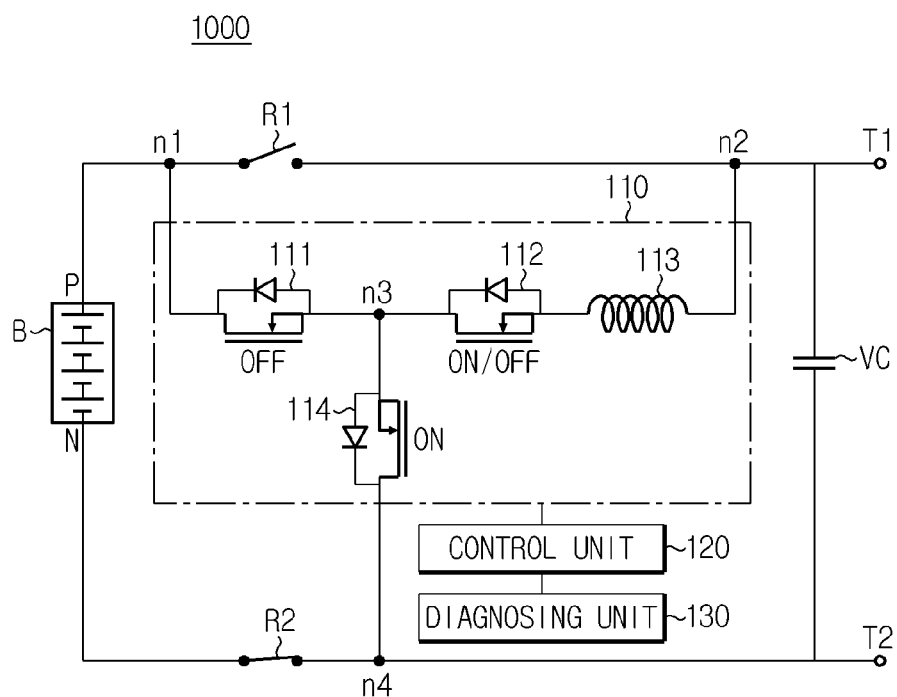
FIGS. 7 to 9 are circuit diagrams for illustrating a process of applying an AC voltage to the first main relay so that the battery management apparatus according to an embodiment of the present disclosure diagnoses the first main relay.
Figure 8:
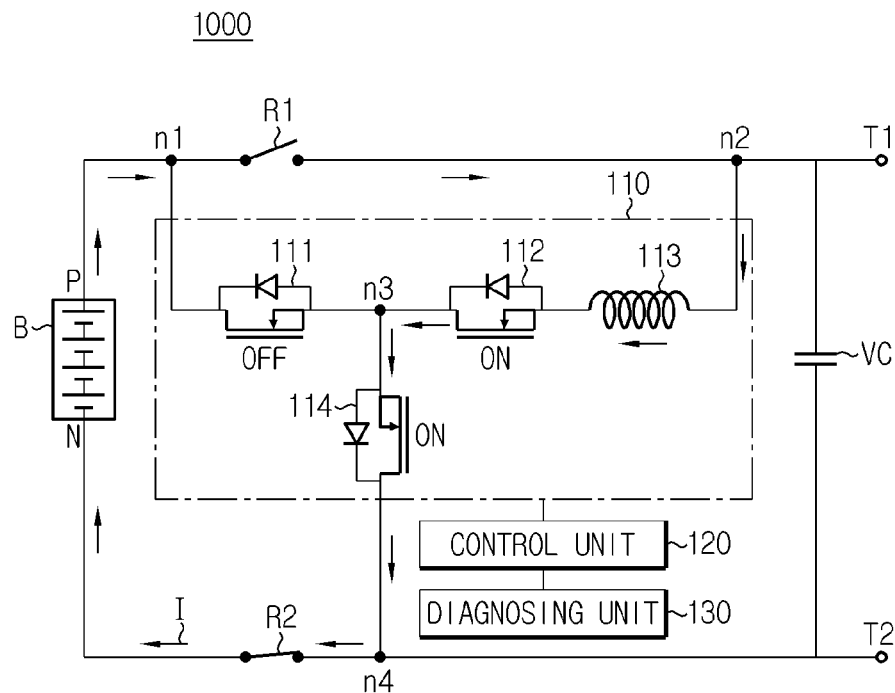
Figure 9:
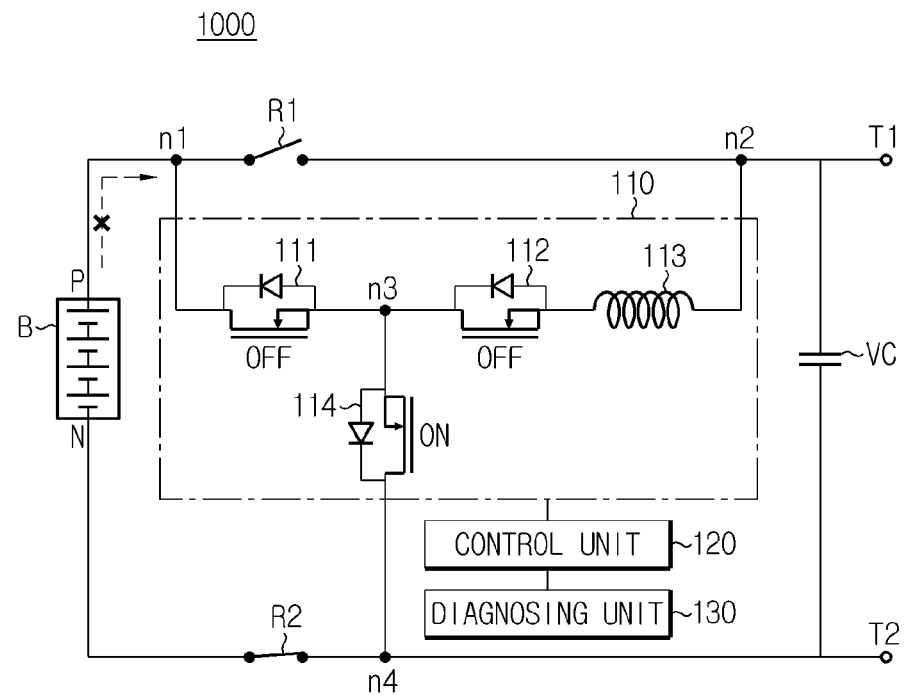

FIGS. 7 to 9 are circuit diagrams for illustrating the process of applying an AC voltage to the first main relay R1 so that the battery management apparatus 100 according to an embodiment of the present disclosure diagnoses the first main relay R1.

Referring to FIGS. 7 to 9 further, when the control unit 120 according to an embodiment receives a first diagnosis command signal for diagnosing a failure of the first main relay R1 from the diagnosing unit 130, the control unit 120 may receive power to initiate the operation.

After that, as shown in FIG. 7, in response to the first diagnosis command signal, the control unit 120 may control the first switch 111 to the OFF state and control the third switch 114 to the ON state, and then control the second switch 112 to alternately repeat the ON state and the OFF state.

At this time, the operation state of the first main relay R1 may be the OFF state, and the operation state of the second main relay R2 may be the ON state.

That is, if the first diagnosis command signal is received, the control unit 120 may control the first switch 111 and the third switch 114 to the OFF state and the ON state, respectively, and then control the operation state of only the second switch 112 to alternately repeat the ON state and the OFF state.

As shown in FIG. 8, the control unit 120 may control the first switch 111 and the third switch 114 to the OFF state and the ON state, respectively, and then control the operation state of the second switch 112 to the ON state.

Accordingly, the output voltage of the battery module B is applied to a closed circuit in which the first main relay R1, the inductor 113, the second switch 112, the third switch 114 and the second main relay R2 are serially connected in order, and the voltage may be applied to the first main relay R1 so that current may flow.

On the contrary, as shown in FIG. 9, the control unit 120 may control the first switch 111 and the third switch 114 to the OFF state and the ON state, respectively, and then control the operation state of the second switch 112 to the OFF state.

Accordingly, all circuits connected to the positive electrode terminal P and the negative electrode terminal N of the battery module B are opened so that no voltage is applied to the first main relay R1 and no current flows.

As described above, the control unit 120 may apply an AC voltage to the first main relay R1 by controlling the first switch 111 and the third switch 114 to the OFF state and the ON state, respectively, and then controlling the operation state of only the second switch 112 to alternately repeat the ON state and the OFF state.

At this time, the control unit 120 may set so that the AC current of a preset first current value flows to the first main relay R1 by controlling the plurality of switches 111, 112, 114 described above, and may set so that the AC current of a preset first frequency flows to the first main relay R1.

Meanwhile, as described above, the diagnosing unit 130 may transmit the first diagnosis command signal to the control unit 120 to diagnose a failure of the first main relay R1. After that, the diagnosing unit 130 may diagnose a failure of the first main relay R1 based on first both-end voltage value of the first main relay R1 to which the AC voltage is applied, as the control unit 120 controls the plurality of switches 111, 112, 114 provided in the precharging unit 110.

More specifically, after the first diagnosis command signal is transmitted to the control unit 120, if an AC voltage is applied to the first main relay R1, the diagnosing unit 130 may compare the first both-end voltage value with a first partial fusion voltage value, and then diagnose that partial fusion occurs at the first main relay R1 if the first both-end voltage value is equal to the first partial fusion voltage value.

On the contrary, after the first diagnosis command signal is transmitted to the control unit 120, if an AC voltage is applied to the first main relay R1, the diagnosing unit 130 may compare the first both-end voltage value with a preset first normal voltage value, and then diagnose that no partial fusion occurs at the first main relay R1 if the first both-end voltage value is equal to the preset first normal voltage value.

Here, if the AC voltage is applied to the first main relay R1 where partial fusion occurs as the control unit 120 receiving the first diagnosis command signal controls the plurality of switches 111, 112, 114, the first partial fusion voltage value may be a voltage value measured at both ends of the first main relay R1.

As shown in FIG. 5, if the operation state of the first main relay R1 where no partial fusion occurs is the OFF state, a capacitance component C may be generated between the first movable contact point OP1 and the fixed contact point FP, and a capacitance component C may also be generated between the second movable contact point OP2 and the fixed contact point FP. Accordingly, two capacitance components C may be serially connected to the first main relay R1 where no partial fusion occurs, and thus a capacitance component C/2 is generated in total.

On the contrary, as shown in FIG. 6, if the operation state of the first main relay R1 where partial fusion occurs is the OFF state, the capacitance component disappears between the first movable contact point OP1 and the fixed contact point FP, and a capacitance component C may also be generated between the second movable contact point OP2 and the fixed contact point FP. Accordingly, only one capacitance component C is generated in the first main relay R1 where partial fusion occurs, and thus the capacitance component C may be generated in total.

The control unit 120 receiving the first diagnosis command signal may control the plurality of switches 111, 112, 114 such that the AC current of a preset first current value and a preset first frequency flows at the first main relay R1 as described above.

At this time, the diagnosing unit 130 may set the first partial fusion voltage value by using the preset first current value, the preset first frequency and the total capacitance of the first main relay R1 where partial fusion occurs, and diagnose partial fusion of the first main relay R1 by comparing the first partial fusion voltage value with the first two-end voltage value of the first main relay R1.

More specifically, the diagnosing unit 130 may set the first partial fusion voltage value using Equation 3 below.

$$V1' = I1(\pi/2)fC \qquad \text{<Equation 3>}$$

Here, V1' may represent a first partial fusion voltage value, I1 may represent a preset first current value, f may represent a preset first frequency, and C may represent a total capacitance of the first main relay R1 where partial fusion occurs.

By doing so, the diagnosing unit 130 may diagnose that partial fusion occurs at the first main relay R1 if the first both-end voltage value of the first main relay R1 is equal to the first partial fusion voltage value.

It has been described that the diagnosing unit 130 according to an embodiment as described above diagnoses that partial fusion occurs at the first main relay R1 if the first both-end voltage value is equal to the first partial fusion voltage value. However, the diagnosing unit 130 according to another embodiment may set a first partial fusion voltage range again based on the first partial fusion voltage value, and then diagnose that partial fusion occurs at the first main relay R1 if the first both-end voltage value is included in the first partial fusion voltage range.

By doing so, the diagnosing unit 130 according to another embodiment may prevent a diagnosis error caused by a circuit configuration in the battery pack 1000 and a measurement error due to a voltage sensor and a current sensor.

Meanwhile, the diagnosing unit 130 may the first normal voltage value by using the preset first current value, the preset first frequency and the total capacitance of the first main relay R1 where partial fusion occurs, and then diagnose whether the first main relay R1 is normal by comparing the set first normal voltage value with the first both-end voltage value of the first main relay R1.

More specifically, the diagnosing unit 130 may set the first normal voltage value using Equation 4 below.

$$V1 = I1(\pi/2)/f(C/2) \qquad \text{<Equation 4>}$$

Here, V1 may represent a first normal voltage value, I1 may represent a preset first current value, f may represent a preset first frequency, and C may represent a total capacitance of the first main relay R1 where partial fusion occurs.

By doing so, the diagnosing unit 130 may diagnose that no partial fusion occurs at the first main relay R1 if the first both-end voltage value of the first main relay R1 is equal to the first normal voltage value.

It has been described that the diagnosing unit 130 according to an embodiment as described above diagnoses that no partial fusion occurs at the first main relay R1 if the first both-end voltage value is equal to the first normal voltage value. However, the diagnosing unit 130 according to another embodiment may set a first normal voltage range again based on the set first normal voltage value, and then diagnose that no partial fusion occurs at the first main relay R1 if the first both-end voltage value is included in the first normal voltage range.

By doing so, the diagnosing unit 130 according to another embodiment may prevent a diagnosis error caused by a circuit configuration in the battery pack 1000 and a measurement error due to a voltage sensor and a current sensor.

Meanwhile, the diagnosing unit 130 according to another embodiment may diagnose that no partial fusion occurs at the first main relay R1 if the first both-end voltage value is different from the first partial fusion voltage value.

In addition, the diagnosing unit 130 according to another embodiment may diagnose that the first main relay R1 has a failure other than the partial fusion if the first both-end voltage value is different from the first partial fusion voltage value and the first normal voltage value.

Meanwhile, if it is diagnosed that partial fusion occurs at the first main relay R1, the diagnosing unit 130 may stop the charge/discharge of the battery pack 1000 by controlling the operation states of the first main relay and the second main relay to the OFF state.

Hereinafter, the process of precharging the battery management apparatus 100 according to an embodiment of the present disclosure will be described.

FIGS. 10 to 13 are circuit diagrams for illustrating a process of controlling the plurality of switches 111, 112, 114 provided in the precharging unit 110 so that the battery management apparatus 100 according to an embodiment of the present disclosure performs precharging.

Referring to FIGS. 10 to 13 further, in order to perform precharging, the diagnosing unit 130 may control the operation state of the second main relay R2 to the ON state and then transmit a precharge command signal to the control unit 120.

When receiving the precharge command signal, the control unit 120 may receive power to initiate the operation.

Figure 10:
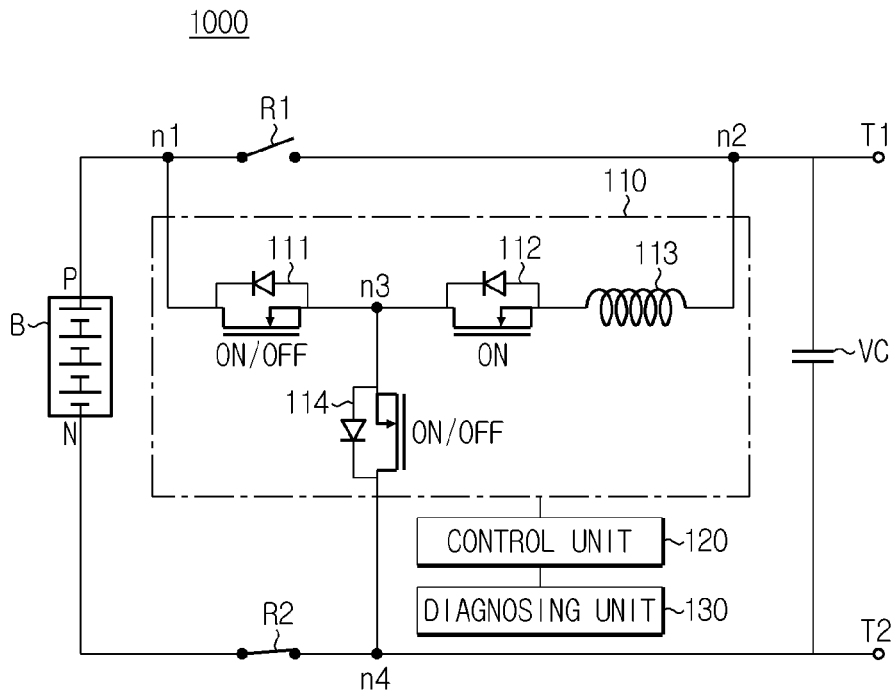
FIGS. 10 to 13 are circuit diagrams for illustrating a process of controlling a plurality of switches provided at the precharging unit so that the battery management apparatus according to an embodiment of the present disclosure performs precharging.

After that, as shown in FIG. 10, in response to the precharge command signal, the control unit 120 may control the second switch 112 to the ON state, and then control the first switch 111 and the third switch 114 to alternately repeat the ON state and the OFF state.

At this time, the operation state of the first main relay R1 may be the OFF state, and the operation state of the second main relay R2 may be the ON state.

That is, if the precharge command signal is received, the control unit 120 may control the second switch 112 to the ON state, and control the first switch 111 and the third switch 114 to alternately repeat the OFF state and the ON state.

Figure 11:
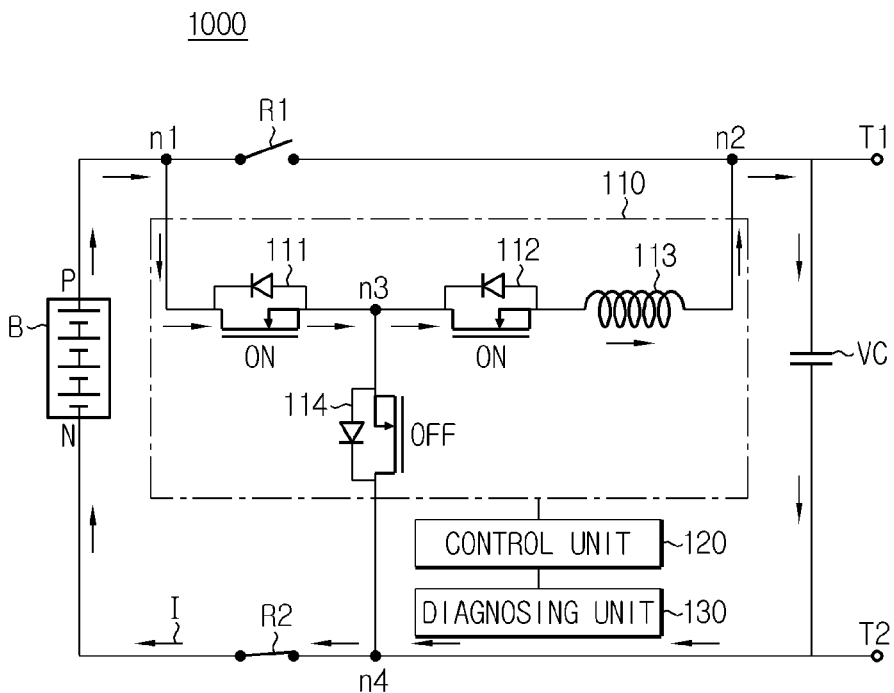

As shown in FIG. 11, the control unit 120 may control the second switch 112 to the ON state, and then control the first switch 111 and the third switch 114 to the ON state and the OFF state, respectively.

Accordingly, the output voltage of the battery module B is applied to a closed circuit in which the first switch 111, the second switch 112, the inductor 113, the output capacitor VC and the second main relay R2 are serially connected in order, so that the inductor 113 and the output capacitor VC may be charged.

Figure 12:
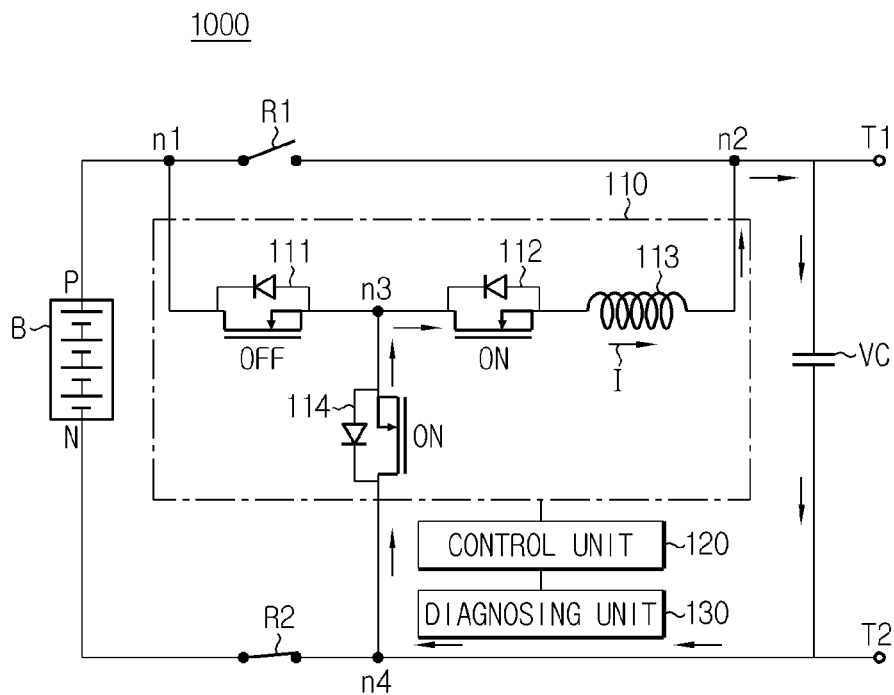
Figure 13:
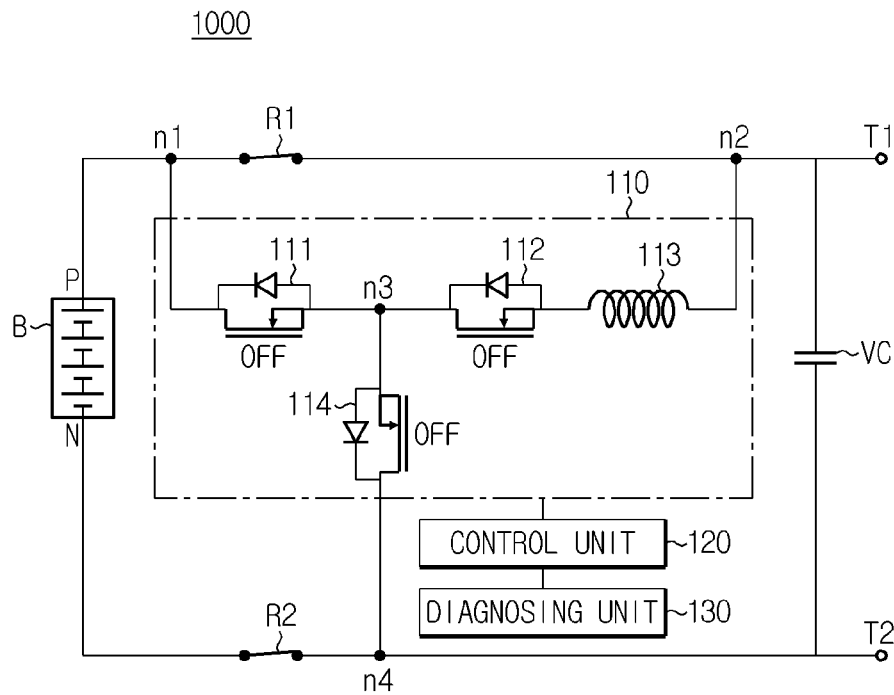

On the contrary, as shown in FIG. 12, the control unit 120 may control the second switch 112 to the ON state, and then control the first switch 111 and the third switch 114 to the OFF state and the ON state, respectively.

Accordingly, the circuits connected to the positive electrode terminal P and the negative electrode terminal N of the battery module B are opened to constitute a closed circuit in which the second switch 112, the inductor 113, the output capacitor VC and the third switch 114 are serially connected in order, and the power charged to the inductor 113 in the closed circuit may be charged to the output capacitor VC.

As the control unit 120 controls the switches as above, it is possible to prevent a high voltage of the battery module B from being suddenly output to the first charge/discharge terminal T1 and the second charge/discharge terminal T2 of the battery pack 1000.

Meanwhile, if the control unit 120 repeatedly controls the switches as above, the charging voltage of the output capacitor VC may be gradually increased.

At this time, the diagnosing unit 130 may compare the charging voltage value of the output capacitor VC with a preset reference voltage value and terminate the precharging in response to the comparison result.

More specifically, if the charging voltage value is greater than the preset reference voltage value as a result of comparing the charging voltage value of the output capacitor VC with the preset reference voltage value, the diagnosing unit 130 may terminate the precharging. Accordingly, if the charging voltage value is greater than the preset reference voltage value, the diagnosing unit 130 may transmit a precharge ending command to the control unit 120.

If the precharge ending command is received, the control unit 120 may control the operation states of all of the plurality of switches 111, 112, 114 provided in the precharging unit 110 to the OFF state.

At the same time, the diagnosing unit 130 may control the operation state of the first main relay R1, which has been maintained in the OFF state, to the ON state to connect the positive electrode terminal P of the battery module B to the first charge/discharge terminal T1 and connect the negative electrode terminal N of the battery module B to the second charge/discharge terminal T2, thereby outputting the power of the battery pack 1000 to the outside.

According to the configuration of the present disclosure, the time required for precharging may be shortened by controlling the plurality of switches 111, 112, 114 composed of MOSFETs, which are electronic semiconductors, through the control unit 120 that generates a waveform.

Meanwhile, the battery pack 1000 according to the present disclosure includes at least one battery module B as described above. At this time, in addition to the battery module B, the battery pack 1000 may further include a case for accommodating the battery module B, a cartridge, a bus bar and the like. In particular, the battery pack 1000 according to the present disclosure may further include the battery management apparatus 100 described above to perform precharging and diagnose whether the main relay has a failure.

The battery management apparatus 100 according to the present disclosure may be applied to a vehicle such as an electric vehicle or a hybrid vehicle. In other words, the vehicle according to the present disclosure may include the battery management apparatus 100 according to the present disclosure.

The present disclosure can be substituted, modified or changed in various ways without departing from the scope of the present disclosure by those skilled in the art and thus is not limited to the above embodiments and the accompanying drawings.

What is claimed is:

1. A battery management apparatus for managing a battery pack, which includes a battery module, a first charge/discharge terminal, a second charge/discharge terminal, a first main relay connected between a positive electrode terminal of the battery module and the first charge/discharge terminal, and a second main relay connected between a negative electrode terminal of the battery module and the second charge/discharge terminal, the battery management apparatus comprising:
a precharging unit having a plurality of switches, the precharging unit being connected to the first main relay in parallel and connected between the second main relay and the second charge/discharge terminal;
a control unit configured to control the plurality of switches to cause an output voltage of the battery module to be converted into an AC voltage and applied to the first main relay or the second main relay; and
a diagnosing unit configured to diagnose a failure of the first main relay based on a first both-end voltage value of the first main relay when the AC voltage is applied to the first main relay, and to diagnose a failure of the second main relay based on a second both-end voltage value of the second main relay when the AC voltage is applied to the second main relay.

2. The battery management apparatus according to claim 1,
wherein the precharging unit includes:
a first switch having one end connected to a first node between the first main relay and the positive electrode terminal;
a second switch having one end connected to the other end of the first switch;
an inductor having one end connected to the other end of the second switch and having the other end connected to a second node between the first main relay and the first charge/discharge terminal; and
a third switch having one end connected to a third node between the first switch and the second switch and having the other end connected to a fourth node between the second main relay and the second charge/discharge terminal.

3. The battery management apparatus according to claim 2,
wherein when the first main relay and the second main relay are in an OFF state, the control unit in configured to control the second switch to an OFF state and controls the third switch to an ON state, and then to control the first switch to repeatedly alternate between an ON state and an OFF state in a manner that causes the AC voltage to be applied to the second main relay.

4. The battery management apparatus according to claim 2,
wherein when the first main relay is in an OFF state and the second main relay is in an ON state, the control unit is configured to control the first switch to an OFF state and controls the third switch to an ON state, and then to control the second switch to repeatedly alternate between an ON state and an OFF state in a manner that causes the AC voltage to be applied to the first main relay.

5. The battery management apparatus according to claim 1,
wherein when the AC voltage is applied to the first main relay, the diagnosing unit is configured to compare the first both-end voltage value with a first partial fusion voltage value, and to diagnose that partial fusion occurs at the first main relay when the first both-end voltage value is equal to the first partial fusion voltage value as a result of the comparison.

6. The battery management apparatus according to claim 1,
wherein when the AC voltage is applied to the first main relay, the diagnosing unit is configured to compare the first both-end voltage value with a preset first normal voltage value, and to diagnose that no partial fusion occurs at the first main relay when the first both-end voltage value is equal to the preset first normal voltage value as a result of the comparison.

7. The battery management apparatus according to claim 1,
wherein when the AC voltage is applied to the second main relay, the diagnosing unit is configured to compare the second both-end voltage value with a second partial fusion voltage value, and to diagnose that partial fusion occurs at the second main relay when the second both-end voltage value is equal to the second partial fusion voltage value as a result of the comparison.

8. The battery management apparatus according to claim 2,
wherein when the AC voltage is applied to the second main relay, the diagnosing unit is configured to compare the second both-end voltage value with a preset second normal voltage value, and to diagnose that no partial fusion occurs at the second main relay when the second both-end voltage value is equal to the preset second normal voltage value as a result of the comparison.

9. A battery pack, comprising a battery management apparatus according to claim 1.

10. A vehicle, comprising a battery management apparatus according to claim 1.

* * * * *